(12) United States Patent
Basker et al.

(10) Patent No.: US 9,929,163 B2
(45) Date of Patent: *Mar. 27, 2018

(54) SELECTIVE EPITAXY GROWTH FOR SEMICONDUCTOR DEVICES WITH FIN FIELD-EFFECT TRANSISTORS (FINFET)

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Los Altos, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/414,472

(22) Filed: Jan. 24, 2017

(65) Prior Publication Data

US 2017/0148798 A1 May 25, 2017

Related U.S. Application Data

(63) Continuation of application No. 14/951,324, filed on Nov. 24, 2015, now Pat. No. 9,659,942.

(51) Int. Cl.
| | | |
|---|---|---|
| H01L 27/11 | (2006.01) | |
| H01L 29/66 | (2006.01) | |
| H01L 21/265 | (2006.01) | |
| H01L 21/306 | (2006.01) | |

(52) U.S. Cl.
CPC .... H01L 27/1104 (2013.01); H01L 21/26586 (2013.01); H01L 21/30604 (2013.01); H01L 29/6653 (2013.01); H01L 29/66545 (2013.01); H01L 29/66795 (2013.01)

(58) Field of Classification Search
CPC ........... H01L 27/1104; H01L 29/66545; H01L 29/6653; H01L 21/26586; H01L 21/30604; H01L 29/66795
See application file for complete search history.

(56) References Cited

U.S. PATENT DOCUMENTS

| | | |
|---|---|---|
| 4,956,314 A | 9/1990 | Tam et al. |
| 6,344,396 B1 | 2/2002 | Ishida et al. |
| 6,794,256 B1 | 9/2004 | Fuselier et al. |
| 7,863,136 B2 | 1/2011 | Goldbach et al. |
| 7,939,436 B2 | 5/2011 | Kim |
| 8,158,482 B2 | 4/2012 | Hoentschel et al. |
| 8,269,284 B2 | 9/2012 | Nil |
| 8,716,797 B2 | 5/2014 | Basker |
| 9,263,257 B2 | 2/2016 | Chien et al. |
| 9,324,870 B2 | 4/2016 | Basker |

(Continued)

OTHER PUBLICATIONS

List of IBM Patents or Applications Treated as Related.

(Continued)

*Primary Examiner* — William Coleman
(74) *Attorney, Agent, or Firm* — Sherman IP LLP; Kenneth L. Sherman; Steven Laut

(57) ABSTRACT

A method for forming a semiconductor device includes depositing spacer material on a first sidewall and a second sidewall of a fin formed on a substrate. An angled ion implantation process is performed at a predetermined angle on a first sidewall of a fin to cause damage to the first sidewall of the fin. The damage caused to the first sidewall of the fin is removed.

18 Claims, 9 Drawing Sheets

(56) References Cited

U.S. PATENT DOCUMENTS

| | | |
|---|---|---|
| 2009/0159936 A1 | 6/2009 | Shah et al. |
| 2011/0108930 A1 | 5/2011 | Cheng et al. |
| 2012/0223386 A1 | 9/2012 | Cheng et al. |
| 2014/0138773 A1 | 5/2014 | Cheng |
| 2014/0346574 A1 | 11/2014 | Cai |
| 2014/0361354 A1 | 12/2014 | Ting |
| 2015/0021689 A1 | 1/2015 | Basker et al. |
| 2015/0179509 A1 | 6/2015 | Limdulpaiboon |

OTHER PUBLICATIONS

Goel, A., et al., "Asymmetric drain spacer extension (ADSE) FinFETs for low-power and robust SRAMs," IEEE Transactions on Electron Devices, Feb. 2011, pp. 296-303, vol. 53, No. 2, United States.

List of IBM Patents or Patent Applications Treated as Related.

SELECTIVE EPITAXY GROWTH FOR SEMICONDUCTOR DEVICES WITH FIN FIELD-EFFECT TRANSISTORS (FINFET)

BACKGROUND

Fin field-effect transistors (FinFETs) typically include a source region and a drain region interconnected by fins which serve as a channel region of the device and a gate that surrounds at least a portion of each of the fins between the source region and the drain region. Epitaxy deposition is typically used to form the source region and the drain region. Dimensions of FinFET devices may be limited by various design considerations including available geographical space in a circuit for the FinFET device and required ratios of various devices in the circuit. In one example, in a static random access memory (SRAM) device, pull-up and pull-down devices must have widths (corresponding to heights in FinFET devices) of predetermined ratios with respect to each other. However, the device width for a FinFET device is determined by the number of fins multiplied by a fin height. Since the number of fins may be limited due to constraints on the size of the FinFET circuit, the device width ratio may be limited for fins with only height. Typically, different device widths are obtained by using different numbers of fins in different FinFETs. In some designs, it is desirable to change an active area of the fins to increase performance of the FinFET. For example, in a SRAM design, a p-type FET (pFET) having a smaller active area is desired to obtain a weaker PFET, which increases device stability. However, since typical pFET designs use only one fin, the number of fins may not be reduced to decrease the active area of the fins.

SUMMARY

One or more embodiments relate to Fin field-effect transistors (FinFETs) and a method of manufacturing the same. In one embodiment, a method for forming a semiconductor device includes depositing spacer material on a first sidewall and a second sidewall of a fin formed on a substrate. An angled ion implantation process is performed at a predetermined angle on a first sidewall of a fin to cause damage to the first sidewall of the fin. The damage caused to the first sidewall of the fin is removed.

These and other features, aspects and advantages of the embodiments will become understood with reference to the following description, appended claims and accompanying figures.

DETAILED DESCRIPTION

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, a "lengthwise" element is an element that extends along a corresponding lengthwise direction, and a "widthwise" element is an element that extends along a corresponding widthwise direction.

Figure 1:
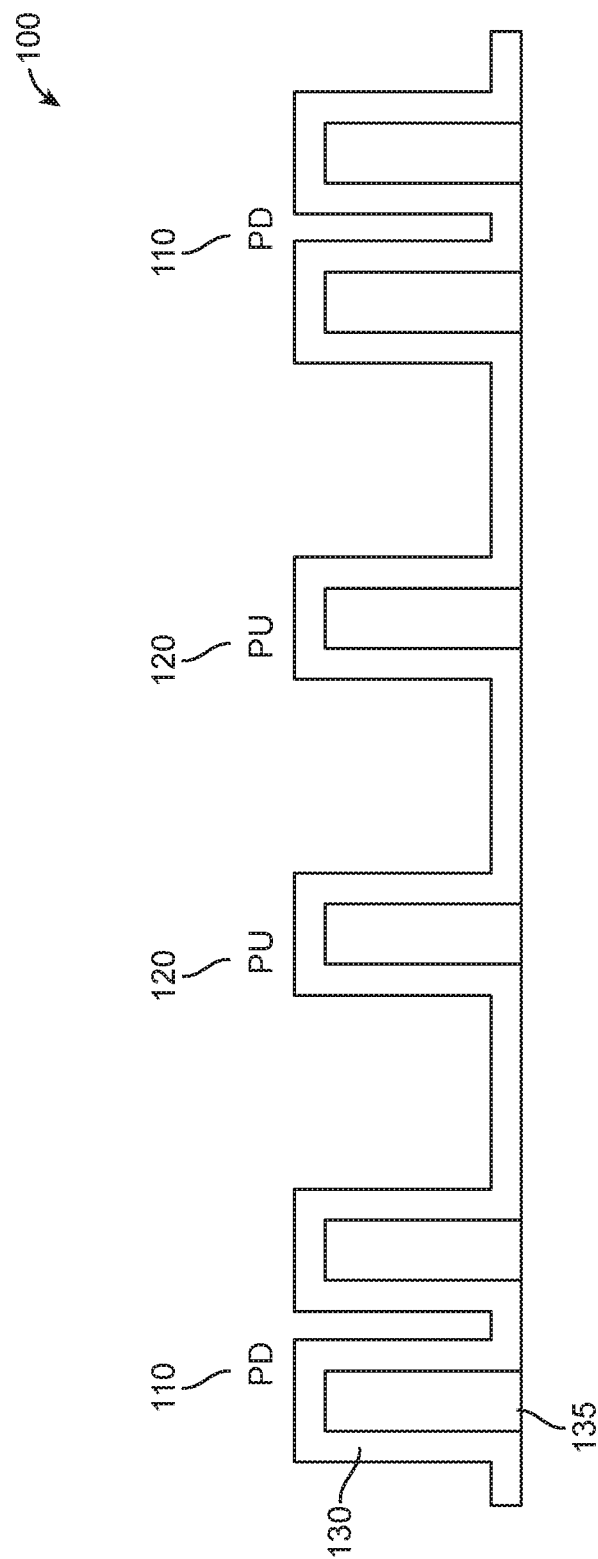
FIG. 1 is a cross-sectional view of an exemplary structure after formation of a deposited and patterned spacer over pull-down fin devices and pull-up fin devices on a substrate, according to an embodiment.

FIG. 1 is a cross-sectional view of an exemplary structure 100 after formation of a deposited and patterned spacer layer 130 (e.g., dielectric material) over pull-down fin devices 110 and pull-up fin devices 120 on fin devices 135, according to an embodiment. In one example, the substrate (e.g., substrate 801, FIG. 8) that the structure is formed on may be a semiconductor-on-insulator (SOI) substrate (e.g., fully-depleted SOI, partially depleted SOI, etc.). In other embodiments, the substrate may be a bulk FinFET, SOI FinFET, Nanowire, etc. In one instance, the spacer may include exemplary dielectric materials, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, etc. The thickness of the spacer layer 130 can be from 1 nm to 5 nm, although lesser and greater thicknesses can also be employed.

The spacer layer 130 may be formed, for example, by conformal deposition such as atomic layer deposition (ALD), chemical vapor deposition (CVD), thermal oxidation, thermal nitridation, etc.

Figure 2:
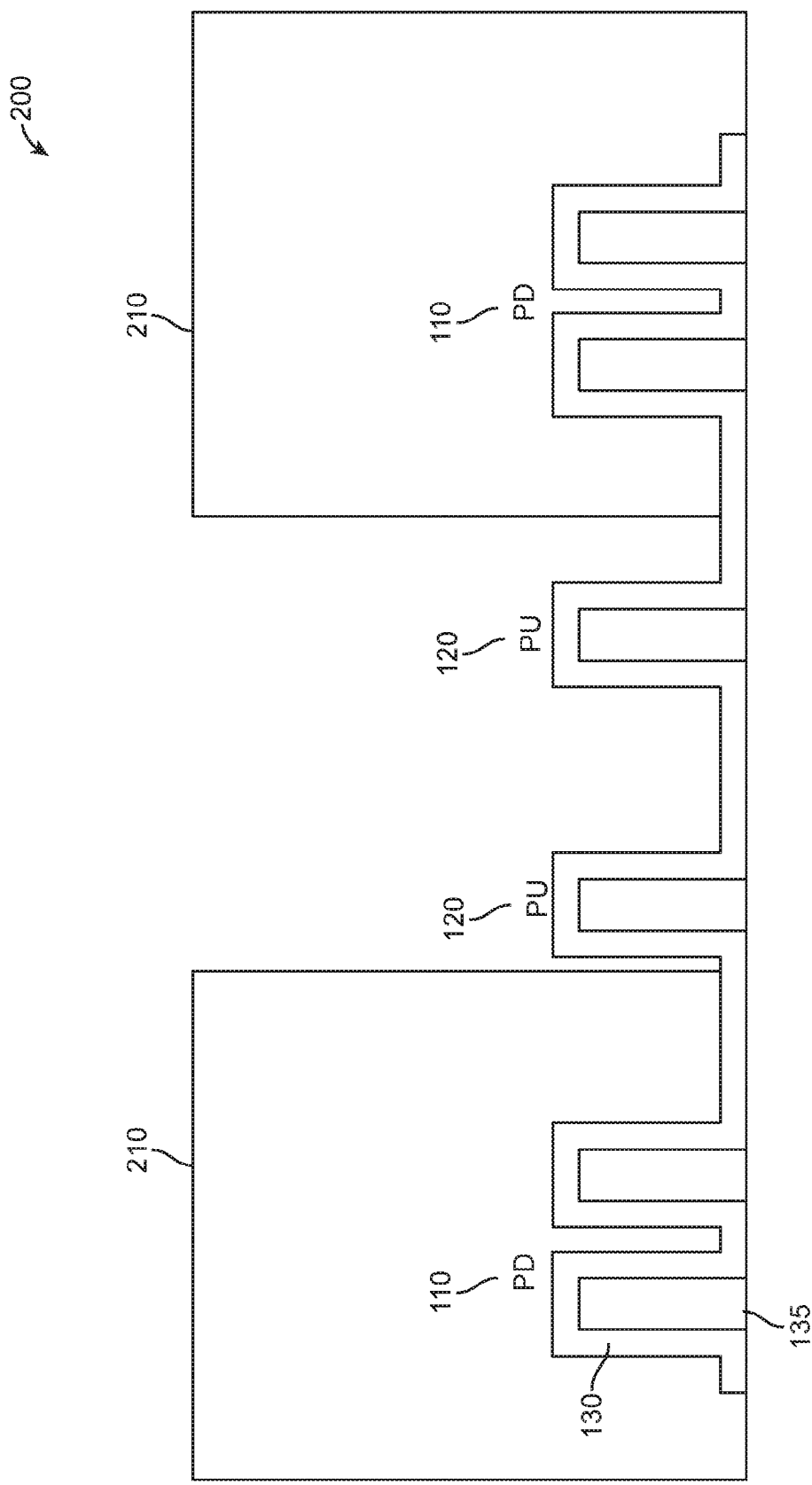
FIG. 2 is a cross-sectional view of the exemplary structure after masking using block copolymer lithography, according to an embodiment.

FIG. 2 is a cross-sectional view of the exemplary structure 200 after masking using block copolymer lithography, according to an embodiment. In one embodiment, the masking 210 may include a patterned photoresist layer that is formed over the pull-down fin devices 110 and the substrate (e.g., substrate 801, FIG. 8). The patterned photoresist layer can be formed, for example, by applying a photoresist layer over the top surface of the spacer layer 130, and block copolymer lithographical patterning the photoresist layer. In one instance, the portions of the spacer layer 130 around and over the pull-up fin devices 120 are not masked. The block lithographical process exposes only the pull-up fin devices 120, which is appropriate for SRAM devices. In other embodiments, the block lithographical process may be arranged to provide further exposure of the pull-up fin devices 120 so that a correct angle may be used for ion implantation (discussed below) for devices, such as logical devices.

In one embodiment, the masking 210 is applied over the exemplary semiconductor structure, and is patterned to form openings in regions including interfaces between the pull-up fin devices 120. In one instance where the masking is a photoresist layer, the photoresist layer can be patterned by lithographic exposure and development. Specifically, the photoresist layer can be applied and patterned over the contiguous pull-up fin devices 120. The locations of openings in the photoresist layer can be selected such that an edge of at least one opening in the photoresist layer overlies the pull-up fin devices 120. In another embodiment, the shape of at least one of the openings in the photoresist layer can be a rectangle having two pairs of parallel straight edges.

Figure 3:
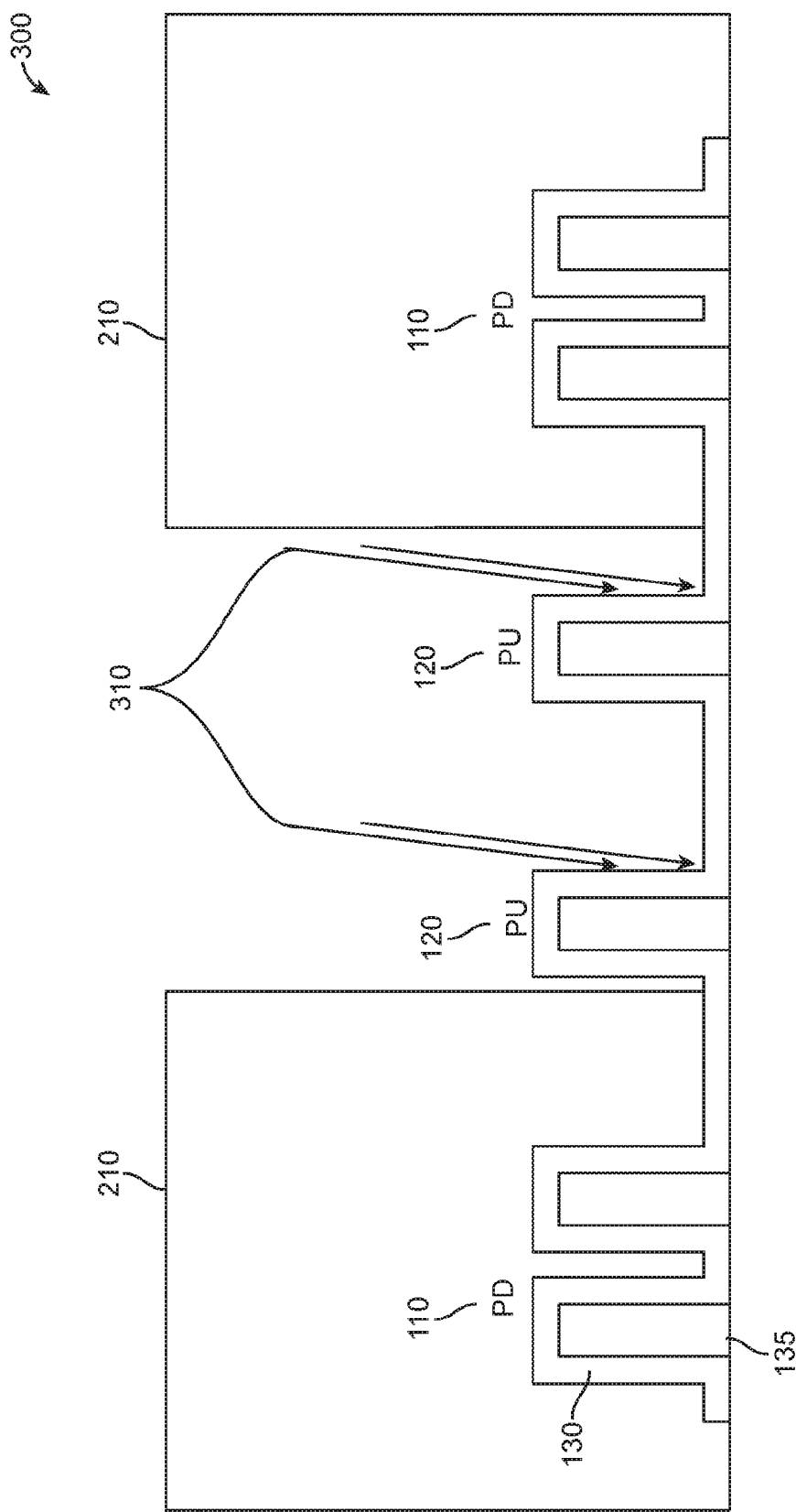
FIG. 3 is a cross-sectional view of the exemplary structure during angled ion implantation to one side of each of the pull-up fin devices, according to an embodiment.

FIG. 3 is a cross-sectional view of the exemplary structure 300 during angled ion implantation to one side of each of the pull-up fin devices 120, according to an embodiment. In one embodiment, xenon (Xe) ion implantation is used. Other implantation species can include, but are not limited to argon (Ar), germanium (Ge). In one example, the ion implantation is angled between 30 to 80 degrees to obtain the desired effect of damaging the spacer layer 130 over the pull-up fin devices 120.

Figure 4:
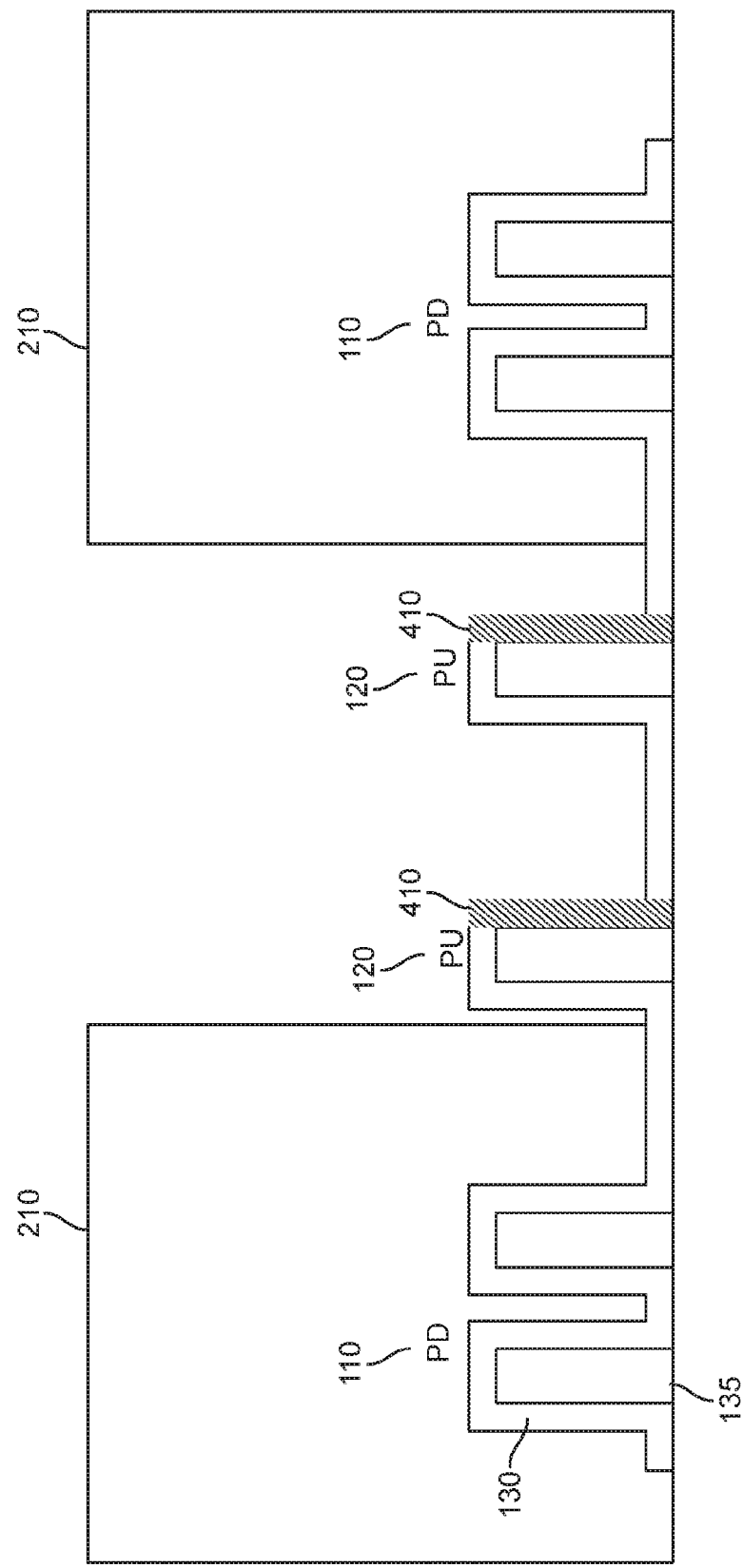
FIG. 4 is a cross-sectional view of the exemplary structure showing damage caused to the spacer on the one side of each of the pull-up fin devices, according to an embodiment.

FIG. 4 is a cross-sectional view of the exemplary structure 400 showing damage 410 caused to the spacer layer 130 on the one side of each of the pull-up fin devices 120, according to an embodiment.

Figure 5:
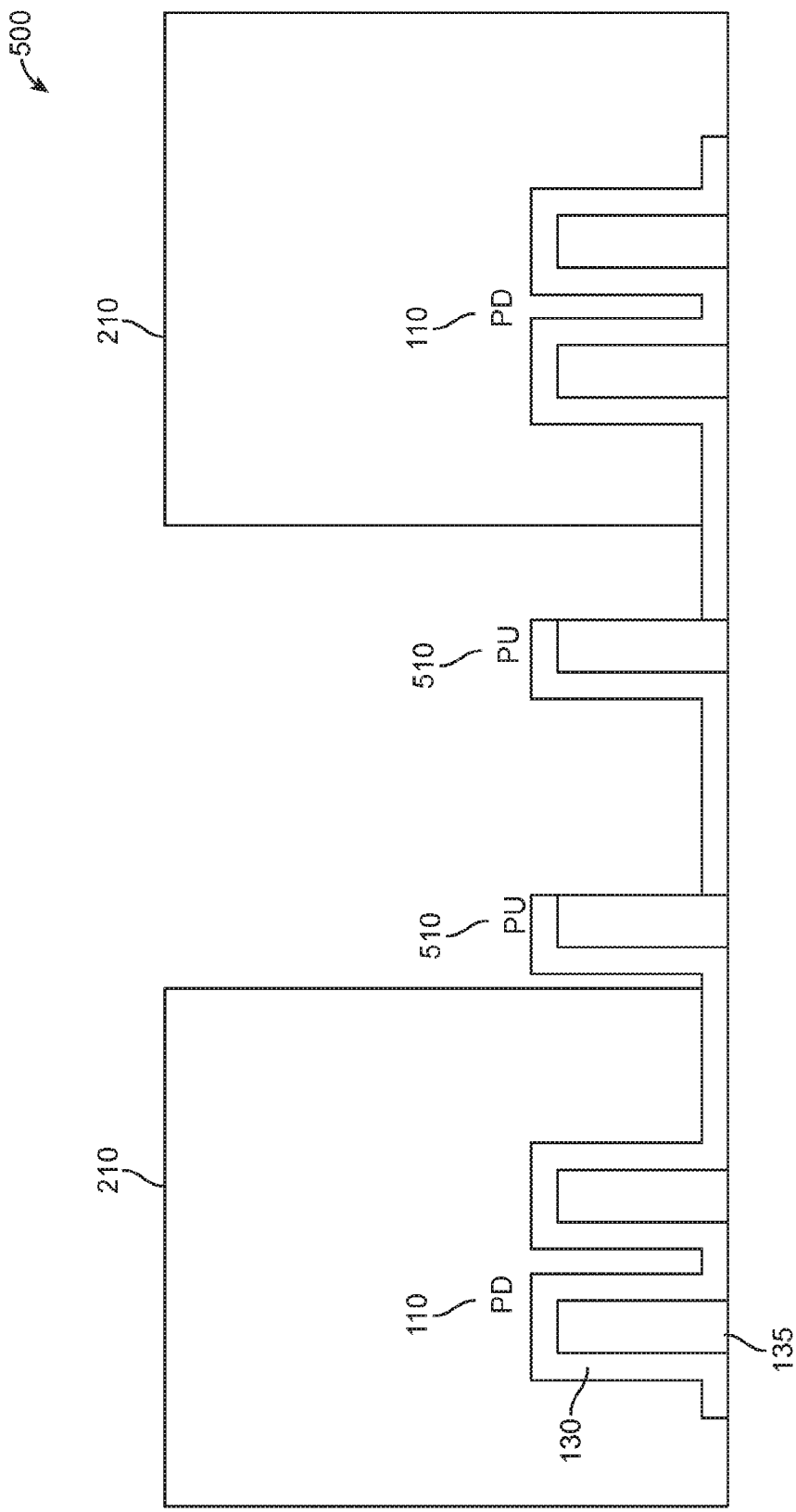
FIG. 5 is a cross-sectional view of the exemplary structure after performing etching to remove the damaged portion of the spacer on the one side of each of the pull-up fin devices, according to an embodiment.

FIG. 5 is a cross-sectional view of the exemplary structure 500 after performing etching to remove the damaged portion 410 of the spacer layer 130 on the one side of each of the pull-up fin devices 120, resulting in the pull-up fin devices 510 according to an embodiment. In one embodiment, an aqueous etchant containing hydrofluoric acid (HF) can be used to remove damaged silicon nitride selective to the undamaged silicon nitride.

Figure 6:
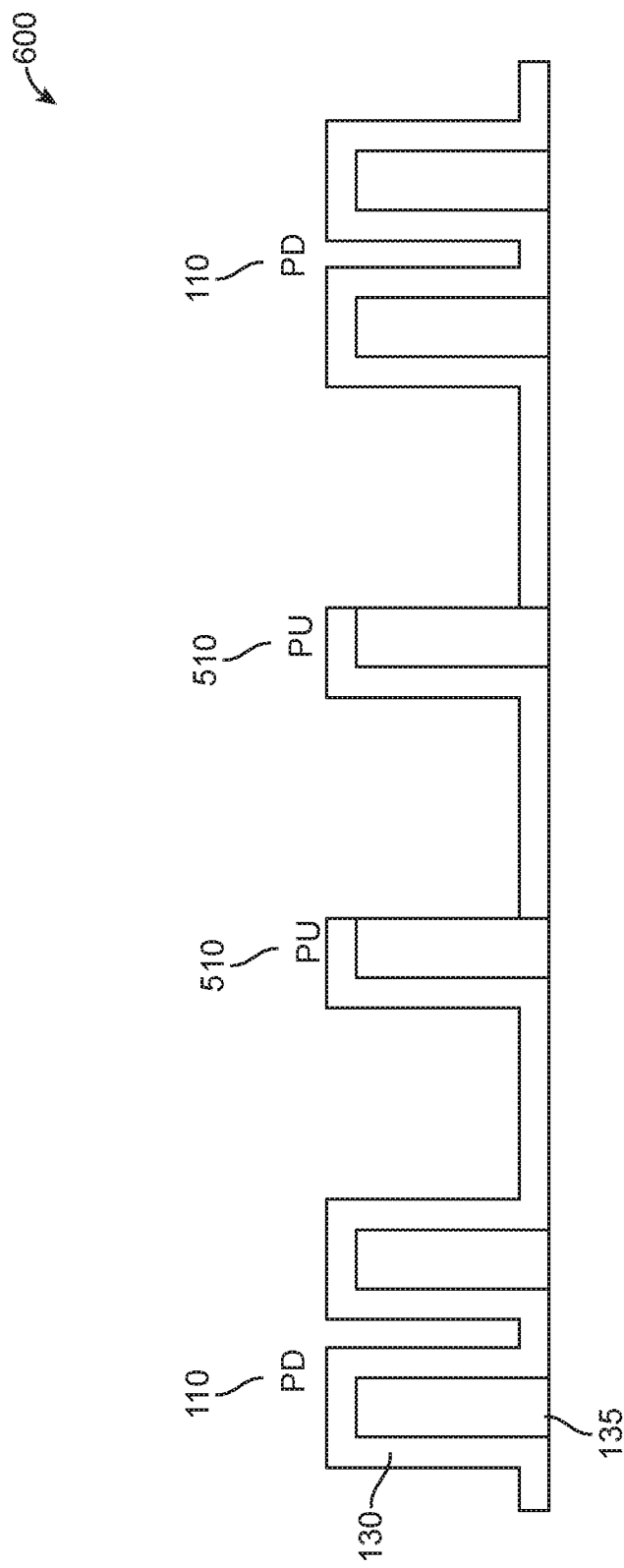
FIG. 6 is a cross-sectional view of the exemplary structure after removing the masking, according to an embodiment.

FIG. 6 is a cross-sectional view of the exemplary structure 600 after removing the masking 210, according to an embodiment. In one embodiment, etching may be used to remove the masking 210.

Figure 7:
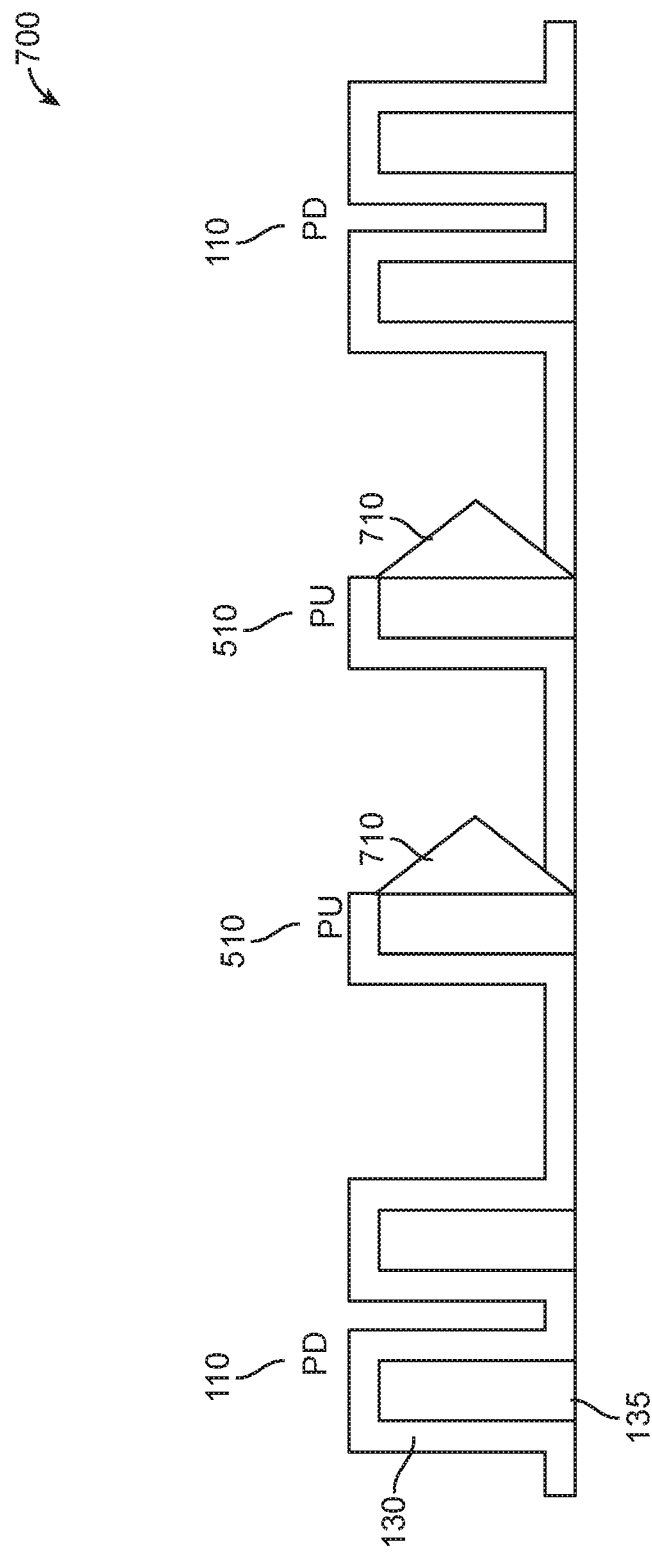
FIG. 7 is a cross-sectional view of the exemplary structure after epitaxy growth of material on the one side of each pull-up fin device, according to an embodiment.

FIG. 7 is a cross-sectional view of the exemplary structure 700 after epitaxy growth of semiconductor material 710 on the one side of each pull-up fin devices 510, according to an embodiment. In one instance, the epitaxy is grown on one side of the pull-up fin devices 510 that have been exposed from the ion implantation and removal of damage by chemical etching. In one embodiment, the semiconductor material is grown on the physically exposed surface of the pull-up fin devices 510 of the exemplary structure 700 by selective epitaxy of the semiconductor material. In one instance, the source regions and the drain regions can be single crystalline, and the selective epitaxy process can provide growth of a single crystalline semiconductor material from the crystalline surfaces of the source regions and the drain regions, while suppressing growth of the semiconductor material on the spacer (dielectric) layer 130 surface. In one or more embodiments, a total on resistance ($R_{on}$) of the FinFET device is decreased and an extension resistance ($R_{ext}$) of the FinFET increases.

In one embodiment, during the selective epitaxy process, one or more deposition processes of a semiconductor material and one or more etch processes of the semiconductor material proceed simultaneously or alternately. The growth rate of the semiconductor material due to the one or more deposition processes on single crystalline surfaces is greater than the deposition rate of the semiconductor material due to the one or more deposition processes on the spacer layer 130 (dielectric surfaces). The etch rate of the semiconductor material due to the one or more etch processes is set to be greater than the deposition rate of the semiconductor material due to the one or more deposition processes on the spacer dielectric surfaces, and to be lesser than growth rate of the semiconductor material due to the one or more deposition processes on the semiconductor surfaces. Thus, a net deposition of the semiconductor material occurs only on the semiconductor surfaces such as the surfaces of the source regions and the drain regions, and does not occur on the spacer layer 130 (dielectric surface), or any contiguous gate cap dielectric, and the insulator layer (or a shallow trench isolation layer if a bulk semiconductor substrate is employed instead of an SOI substrate).

In one embodiment, the semiconductor material 710 formed by the selective epitaxy process form various epitaxy source regions and epitaxy drain regions. The epitaxy source regions and the epitaxy drain regions are collectively referred to as epitaxy active regions. The epitaxy active regions are formed on physically exposed surfaces of the semiconductor pull-up fin devices.

In one embodiment, the duration of the selective epitaxy process is selected so that the neighboring semiconductor pull-down fin devices 110 are not electrically shorted to each other. In one instance, the lateral distance between a neighboring pair of epitaxy source regions or a neighboring pair of epitaxy drain regions can be a sublithographic dimension, i.e., a dimension less than a critical dimension. A critical dimension refers to a dimension that is less than the minimum dimension that can be printed by a single lithographic exposure. In one instance, the duration of the selective epitaxy process can be selected such that some epitaxy active regions on neighboring source regions or on neighboring drain regions are merged into a single contiguous epitaxy active region, while the epitaxy active regions do not merge with any other epitaxy active region. The epitaxy material can be in-situ doped and/or ex-situ doped.

In one instance, for a logical device, the selective epitaxy process may be applied to the opposite side of the pull-up fin device 510 after the opposite side has ion implantation performed, removal of the damaged surface material using HF chemical etching and removal of the masking. In one instance, on logic devices, the epitaxy material is merged since both fin device surfaces will be open for growth.

Figure 8:
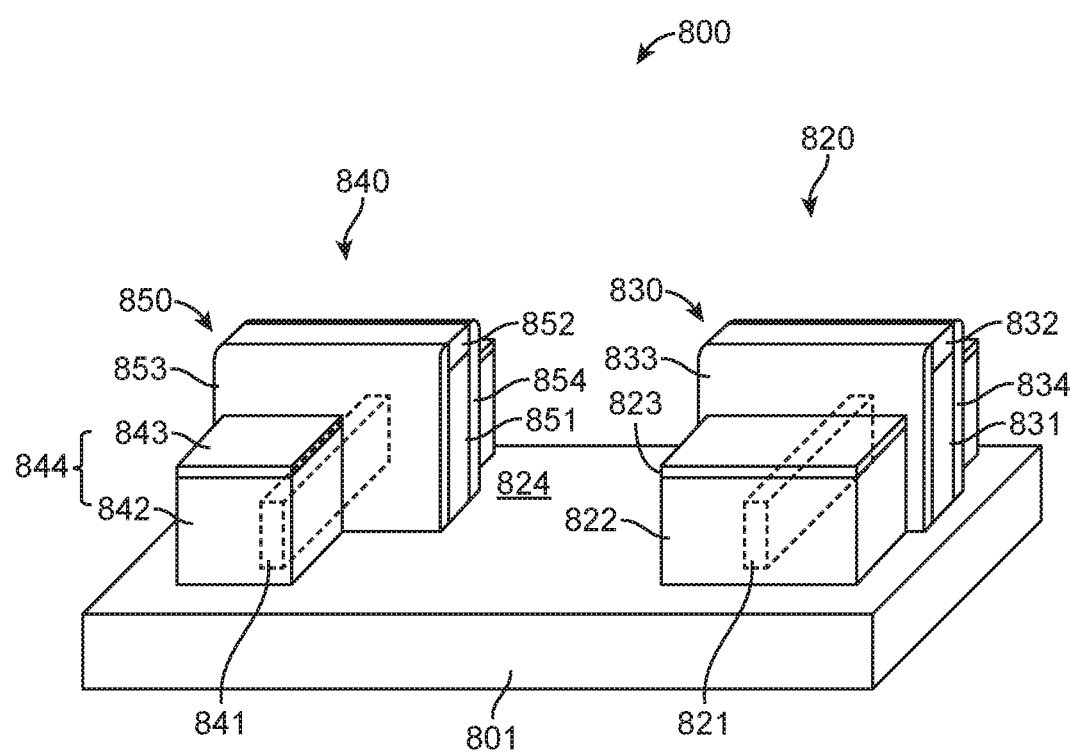
FIG. 8 illustrates a FinFET assembly that may be employed, according to an embodiment.

FIG. 8 illustrates a FinFET assembly 800, that may be employed according to an embodiment. The FinFET assembly 800 includes a substrate 801, a first FinFET device 820 and a second FinFET device 840. The first FinFET device 820 includes merged source/drain (SD) regions 824, including a filling layer 822 and a contact layer 823. A gate structure 830 is located between the SD regions 824. In one or more embodiments, the FinFET assembly 800 may represent an electrical circuit connecting the FinFETs 820 and 840, a wafer on which the FinFETs 820 and 840 are both fabricated or any other assembly including multiple FinFETs 820 and 840 formed on the same substrate 801.

The second FinFET device 840 also includes merged source/drain (SD) regions 844, including a filling layer 842 and a contact layer 843. The second FinFET device 840 also includes a gate structure 850 is located between the SD regions 844.

The first FinFET device 820 is formed around a first fin 821 located on the substrate 801, and the second FinFET device 840 is formed around a second fin 840 located on the substrate 801. The first fin 821 may have a first height and the second fin 841 may have a second height different than the first fin 821. In one example, the first fin 821 has epitaxy on both sides and the second fin 841 has epitaxy on one side (after Xe ion implantation and removal of the damaged portion). The substrate 801 may include one or more of an insulating material and a semiconductive material, such as a silicon-based material. The fins 821 and 841 may comprise a silicon-based material. In one embodiment, the filling material 822 and 842 may be an epitaxial layer, or a layer of silicon, which may be doped silicon, grown epitaxially on the first and second fins 821 and 841. The filling material 822 and 842 may be referred to as a fill material, filling material, epitaxial fill material, or the like. The contact layers 823 and 843 may include a silicide layer. The filling layers 822 and 842 may be semiconductor layers.

The first gate structure 830 of the first FinFET device 820 may include a gate stack layer 831 and a contact layer 832 on the gate stack layer 831. The gate stack layer may include one or more layers of high-dielectric constant (high-k) material under one or more multi-layer metals, doped poly-silicon, and silicide. The gate structure 830 may also include insulating layers 833 and 834 disposed on sidewalls of the gate stack layer 831 and contact layer 832. Similarly, the second gate structure 850 of the second FinFET device 840 may include a gate stack layer 851 and a contact layer 852 on the gate stack layer 851. The gate structure 850 may also include insulating layers 853 and 854 disposed on sidewalls of the gate stack layer 851 and contact layer 852.

Figure 9:
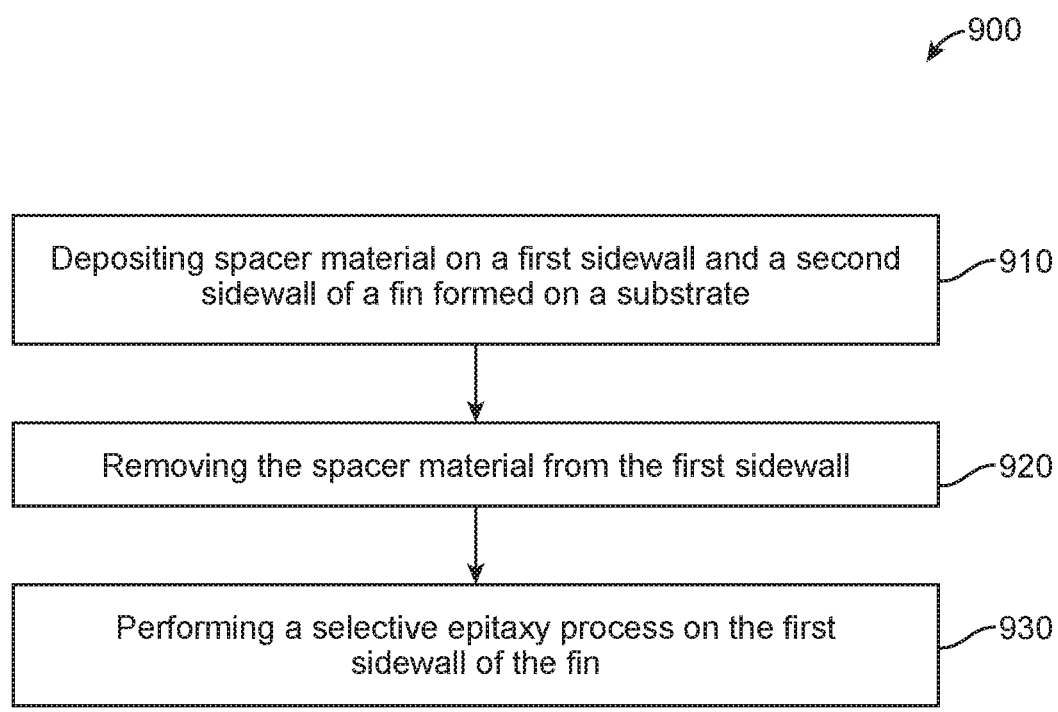
FIG. 9 illustrates a block diagram for a process for forming a semiconductor selective epitaxy growth of material on one side of pull-up fin devices, according to one embodiment.

FIG. 9 illustrates a block diagram for a process 900 for forming a semiconductor structure, according to one embodiment. In one embodiment, in block 910 spacer material is deposited on a first sidewall and a second sidewall of a fin (e.g., sidewalls of a pull-up device fin 120, FIG. 1) formed on a substrate (e.g., substrate 801, FIG. 8). In block 920 the spacer material is removed from the first sidewall (i.e., and not from the second sidewall). In block 930, a selective epitaxy process on the first sidewall of the fin is performed.

In one embodiment, the fin forms part of a FinFET (e.g., FinFET 820, FinFET device 820, FIG. 8) on the substrate, and $R_{on}$ of the FinFET is decreased and $R_{ext}$ of the FinFET increases. In another embodiment, the FinFET is a p-type field-effect transistor (pFET). In one instance, the pFET is part of a SRAM cell.

In one embodiment, process 900 may further include performing an angled ion implantation process on the first sidewall of the fin, and removing damage caused to the first sidewall of the fin prior to performing the selective epitaxy process. In one instance, in process 900 an angled implantation comprises an Xe ion implantation process angled between 30 degrees and 80 degrees. In process 900 the damage is caused to the spacer layer on the first sidewall.

In one embodiment, in process 900 removing the damage includes etching damaged spacer material using an HF solution. In one instance, process 900 may further include removing the spacer material from the second sidewall, and selectively growing an epitaxy layer on the second sidewall of the fin.

Having described preferred embodiments of a method and device for selective epitaxy growth on FinFET devices (which are intended to be illustrative and not limiting), it is noted that modifications and variations can be made by persons skilled in the art in light of the above teachings. It is therefore to be understood that changes may be made in the particular embodiments disclosed which are within the scope of the embodiments as outlined by the appended claims.

References in the claims to an element in the singular is not intended to mean "one and only" unless explicitly so stated, but rather "one or more." All structural and functional equivalents to the elements of the above-described exemplary embodiments that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, materials, and/or components, but do not preclude the presence or addition of one or more other features, steps, operations, elements, materials, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The one or more embodiments were chosen and described in order to best explain the principles of the embodiments and the practical application, and to enable others of ordinary skill in the art to understand the various embodiments with various modifications as are suited to the particular use contemplated.

What is claimed is:

1. A method of forming a semiconductor structure comprising:
   depositing spacer material on a first sidewall and a second sidewall of a fin formed on a substrate;
   performing an angled ion implantation process at a predetermined angle on a first sidewall of a fin to cause damage to the first sidewall of the fin; and
   removing the damage caused to the first sidewall of the fin,
   wherein the fin forms part of a Fin field-effect transistor (FinFET) on a substrate.

2. The method of claim 1, wherein the angled implantation process comprises an Xe ion implantation process, and the predetermined angle is between 30 degrees and 80 degrees.

3. The method of claim 1, further comprising:
   removing the spacer material from the first sidewall of the fin; and
   performing a selective epitaxy process on the first sidewall of the fin.

4. The method of claim 1, wherein a total on resistance ($R_{on}$) of the FinFET is decreased and an extension resistance ($R_{ext}$) of the FinFET increases.

5. The method of claim 1, wherein the damage is caused to the spacer layer on the first sidewall of the fin.

6. The method of claim 1, further comprising:
removing the spacer material from the second sidewall of the fin; and
selectively growing an epitaxy layer on the second sidewall of the fin.

7. A method of forming a semiconductor device, comprising:
forming a first fin and a second fin of a Fin field-effect transistor (FinFET) on a substrate, wherein the FinFET is a p-type field-effect transistor (pFET);
performing angled ion implantation at a predetermined angle on a first side of the first fin and a first side of the second fin;
etching damage caused by the ion implantation from the first side of the first fin and the first side of the second fin for removing the damage caused to the first side of the first fin and to the first side of the second fin; and
selectively growing an epitaxy layer on the first side of the first fin and the first side of the second fin, such that a total on resistance ($R_{on}$) of the FinFET is decreased and an extension resistance ($R_{ext}$) of the FinFET increases.

8. The method of claim 4, wherein the FinFET is a p-type field-effect transistor (pFET).

9. The method of claim 8, wherein the pFET is part of a static random access memory (SRAM) cell.

10. The method of claim 5, wherein removing the damage comprises etching damaged spacer material using a hydrofluoric acid (HF) solution.

11. A semiconductor device, comprising:
a Fin field-effect transistor (FinFET), the FinFET including:
a gate;
a channel region;
a source/drain region; and
a fin including spacer material on a first portion of a first sidewall, the first portion of the first sidewall comprising remaining spacer material from removal of spacer material from a second portion of the first sidewall caused by an angled ion implantation process that damages the spacer material on the second portion of the first sidewall, which is removed from the first sidewall.

12. The semiconductor of claim 11, wherein the fin further includes spacer material on a first portion of a second sidewall, the first portion of the second sidewall comprising remaining spacer material from removal of spacer material from a second portion of the second sidewall caused by the angled ion implantation process that damages the spacer material on the second portion of the second sidewall, which is removed from the second sidewall.

13. The semiconductor of claim 11, wherein the FinFET is a p-type field-effect transistor (pFET) that is part of a static random access memory (SRAM) cell.

14. The method of claim 7, wherein the pFET is part of a static random access memory (SRAM) cell.

15. The method of claim 7, further comprising:
forming a spacer layer on the first fin and the second fin;
forming a masking on the spacer layer on the substrate except for a portion with the first fin and the second fin.

16. The method of claim 7, wherein etching the damage uses hydrofluoric acid (HF).

17. The method of claim 15, further comprising:
removing the masking;
wherein the ion implantation comprises Xe ion implantation, and the predetermined angle is between 30 degrees and 80 degrees.

18. The method of claim 15, wherein forming the masking on the spacer layer on the substrate except for the portion with the first fin and the second fin further comprises performing copolymer block lithography on a first group of pull-down device fins and a second group of pull-down device fins.

* * * * *